(12) United States Patent
Wilson et al.

(10) Patent No.: US 9,263,138 B1
(45) Date of Patent: Feb. 16, 2016

(54) SYSTEMS AND METHODS FOR DYNAMICALLY PROGRAMMING A FLASH MEMORY DEVICE

(71) Applicant: Avago Technologies General IP (Singapore) Pte. Ltd., Singapore (SG)

(72) Inventors: Bruce A. Wilson, San Jose, CA (US); Erich F. Haratsch, San Jose, CA (US)

(73) Assignee: Seagate Technology, Longmont, CO (US)

( * ) Notice: Subject to any disclaimer, the term of this patent is extended or adjusted under 35 U.S.C. 154(b) by 0 days.

(21) Appl. No.: 14/502,283

(22) Filed: Sep. 30, 2014

(51) Int. Cl.
*G11C 16/04* (2006.01)
*G11C 16/10* (2006.01)
*G11C 16/26* (2006.01)

(52) U.S. Cl.
CPC ............... *G11C 16/10* (2013.01); *G11C 16/26* (2013.01)

(58) Field of Classification Search
USPC ................... 365/185.03, 185.09, 185.01
See application file for complete search history.

(56) References Cited

U.S. PATENT DOCUMENTS

| 6,026,024 | A | 2/2000 | Odani et al. | |
|---|---|---|---|---|
| 8,385,116 | B2 | 2/2013 | Kasuga | |
| 2009/0310406 | A1* | 12/2009 | Sarin | G11C 11/5628 365/185.03 |
| 2010/0246287 | A1* | 9/2010 | Vigoda | G11C 7/1006 365/189.15 |

OTHER PUBLICATIONS

Jeong et al "Lifetime Improvement of NAND Flash-based Storage Systems Using Dynamic Program and Erase Scaling" 12th USENIX Conf. on File and Storage Tech Feb. 2014.

* cited by examiner

*Primary Examiner* — Vu Le
(74) *Attorney, Agent, or Firm* — Duft Bornsen & Fettig LLP

(57) ABSTRACT

The present inventions are related to systems and methods for storing data, and more particularly to systems and methods for writing data to a storage device.

20 Claims, 11 Drawing Sheets

```
                                                     ┌─997
┌─────────────────────────────────────────┐
│ Apply Extended Encoding to the Received │
│  Data to Yield a Primary Encoded Write  │
│    Data Set and a Set of Additional     │
│             Encoding Data               │
│                   902                   │
└─────────────────────────────────────────┘
                    │
                    ▼
┌─────────────────────────────────────────┐
│  Apply a Pulsed Voltage to a Flash      │
│  Memory Corresponding to the Primary    │
│        Encoded Write Data Set           │
│                   906                   │
└─────────────────────────────────────────┘
                    │
                    ▼
┌─────────────────────────────────────────┐
│   Read Back the Primary Encoded Write   │
│      Data Set as a Read Back Data Set   │
│                   908                   │
└─────────────────────────────────────────┘
                    │
                    ▼
┌─────────────────────────────────────────┐
│  Degrade the Read Back Data Set to      │
│         Yield a Degraded Data Set       │
│                   912                   │
└─────────────────────────────────────────┘
                    │
                    ▼
┌─────────────────────────────────────────┐
│  Apply Data Decoding to the Degraded    │
│                Data Set                 │
│                   914                   │
└─────────────────────────────────────────┘
                    │
                    ▼
                 ◇ Decoding ◇
                 ◇Converged?◇────Y────┐
                 ◇   916   ◇          │
                    │                 │
                    N                 │
                    ▼                 │
┌─────────────────────────────────────┐│
│ Determine How Much of the Set of    ││
│   Additional Encoding Data is       ││
│              Needed                 ││
│                924                  ││
└─────────────────────────────────────┘│
                    │                 │
                    ▼                 │
┌─────────────────────────────────────┐│
│  Write the Needed Additional        ││
│   Encoding Data to the Flash        ││
│              Memory                 ││
│                926                  ││
└─────────────────────────────────────┘│
                    │                 │
                    ▼                 │
┌─────────────────────────────────────┐│
│  Discard the Unneeded Additional    ││
│          Encoding Data              ││
│                928                  ││
└─────────────────────────────────────┘│
                    │                 │
                    ▼                 ▼
                 ┌──────────┐
                 │End Write │
                 │   922    │
                 └──────────┘
```

Fig. 9

SYSTEMS AND METHODS FOR DYNAMICALLY PROGRAMMING A FLASH MEMORY DEVICE

FIELD OF THE INVENTION

The present inventions are related to systems and methods for storing data, and more particularly to systems and methods for writing data to a storage device.

BACKGROUND

Various data storage systems have been developed that include flash memory devices that are written by applying a series of voltage pulses to the gate of flash cells. These voltage pulses each induce electrons to tunnel from the channel into a floating gate. The tunneling of electrons is not entirely deterministic. Thus, while the average number of electrons added to the gate via the tunneling process can be controlled by varying the voltage and duration of pulses, the precise number of electrons is not necessarily determinable. Because of this, flash memory cells may be written over the course of multiple pulses and the cell checked against a switching threshold after each pulse. Such an approach involves a balance between taking a considerable amount of time to write a number of small voltage pulses exhibiting relatively fine granularity and thus providing a close approximation of the needed number of tunneling electrons, or taking a smaller amount of time to write fewer, but larger voltage pulses which may result in excessive damage to the device due to the introduction of too many tunneling electrons.

Hence, for at least the aforementioned reasons, there exists a need in the art for advanced systems and methods for writing data to a storage device.

SUMMARY

The present inventions are related to systems and methods for storing data, and more particularly to systems and methods for writing data to a storage device.

Various embodiments of the present inventions provide systems for accessing a flash memory device. The systems include: a flash memory write circuit, a flash memory read circuit, a read back degrade circuit, and a data decoder circuit. The flash memory write circuit is operable to apply a first write signal to a flash memory to yield a stored data set. The flash memory read circuit is operable to read the stored data set from the flash memory as a read back input. The read back degrade circuit is operable to degrade the read back input to yield a degraded output, and the data decoder circuit is operable to generate a decoded output from the degraded output to yield a decoded output and a bit error rate. The flash memory write circuit is further operable to apply a second write signal to the flash memory when the bit error rate exceeds a threshold value.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment or one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 9 is a flow diagram showing the method of FIG. 8b modified to additionally include data degradation in accordance with other embodiments of the present invention.

DETAILED DESCRIPTION OF SOME EMBODIMENTS

Figure 1:
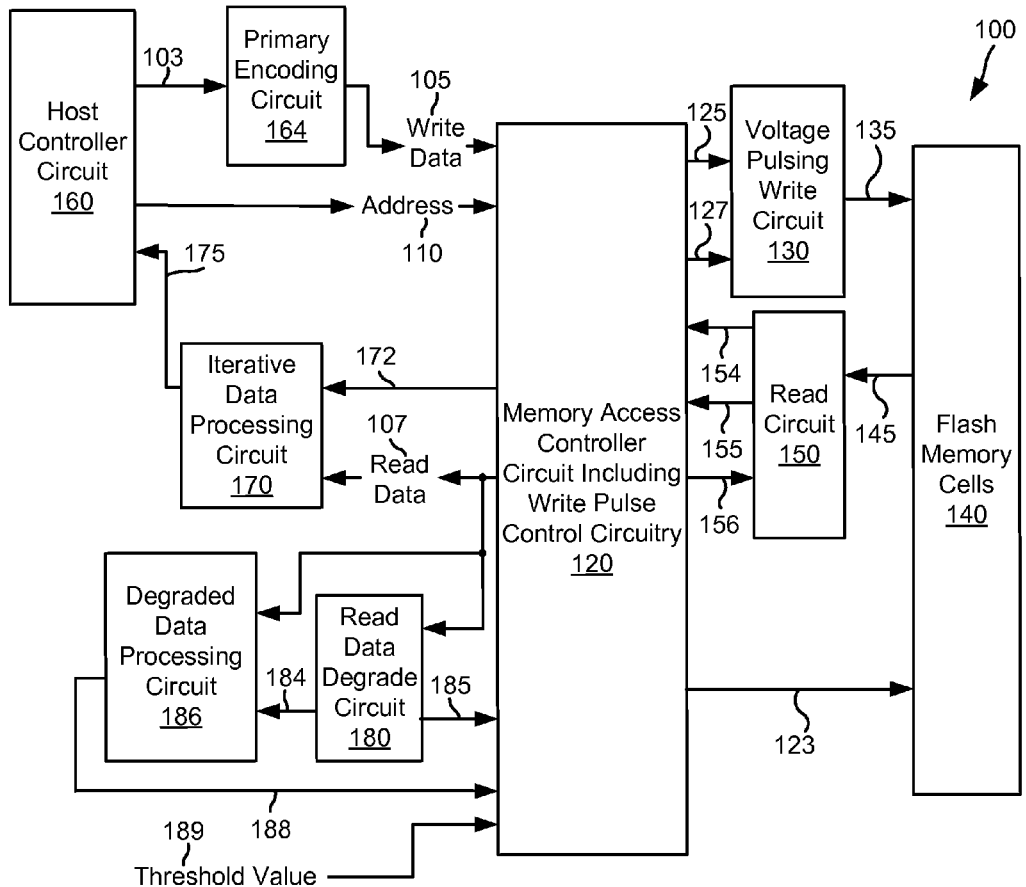
FIG. 1 shows a solid state storage device including dynamic write circuitry in accordance with some embodiments of the present invention.

The present inventions are related to systems and methods for storing data, and more particularly to systems and methods for writing data to a storage device.

Various embodiments of the present inventions provide systems for accessing a flash memory device. The systems include: a flash memory write circuit, a flash memory read circuit, a read back degrade circuit, and a data decoder circuit. The flash memory write circuit is operable to apply a first write signal to a flash memory to yield a stored data set. The flash memory read circuit is operable to read the stored data set from the flash memory as a read back input. The read back degrade circuit is operable to degrade the read back input to yield a degraded output, and the data decoder circuit is operable to generate a decoded output from the degraded output to yield a decoded output and a bit error rate. The flash memory write circuit is further operable to apply a second write signal to the flash memory when the bit error rate exceeds a threshold value. In some instances of the aforementioned embodiments, the data decoder circuit is a low density parity check decoder circuit operable to apply a low density parity check decoder algorithm to the degraded output to yield the decoded output and the bit error rate. In other instances of the aforementioned embodiments, the data decoder circuit is a comparator circuit operable to compare the degraded output to the stored data set to yield a number of bit errors as the bit error rate.

In some instances of the aforementioned embodiments, the threshold value is dynamic. In some such instances, the threshold value is set at a first threshold level when the flash memory has been accessed a first number of times, and wherein the threshold value is set at a second threshold level when the flash memory has been accessed a second number of times. In some cases, the threshold value is user programmable.

In various instances of the aforementioned embodiments, the read back degrade circuit includes a read threshold modification circuit operable to modify a read threshold of the flash memory read circuit to produce the degraded output. In some such instances, the read threshold is modified such that the degraded output corresponds to the stored data set after a defined amount of time in the flash memory. In one or more instances of the aforementioned embodiments, the read back degrade circuit includes a bit erase circuit operable to modify a selected number of bits in the stored data set to correspond to an erase state of the flash memory device. In some cases, the system is implemented as part of an integrated circuit.

Other embodiments of the present invention provide systems for accessing a flash memory device. The flash memory device includes: a flash memory write circuit, a flash memory read circuit, a low density parity check data decoder circuit. The flash memory write circuit is operable to apply a first write signal to a flash memory to yield a stored data set, and the flash memory read circuit is operable to read the stored data set from the flash memory as a read back input. The low density parity check data decoder circuit is operable to apply a low density parity check data decoding algorithm to a decoder input derived from the read back input to yield a decoded output. The flash memory write circuit is further operable to selectively apply a second write signal to the flash memory based at least in part on the decoded output.

In some instances of the aforementioned embodiments, the systems further include a read back degrade circuit that is operable to degrade the read back input to yield a degraded output. In such instances, the decoder input is derived from the degraded output. In some cases, the low density parity check data decoder circuit is further operable to yield a bit error rate associated with the decoded output. In such cases, the flash memory write circuit is further operable to apply a second write signal to the flash memory based at least in part on the bit error rate.

In various instances of the aforementioned embodiments the threshold value is dynamic. In some such instances, the threshold value is set at a first threshold level when the flash memory has been accessed a first number of times, and wherein the threshold value is set at a second threshold level when the flash memory has been accessed a second number of times. In one or more instances of the aforementioned embodiments, the read back signal includes a read threshold modification circuit operable to modify a read threshold of the flash memory read circuit to produce the degraded output. In some such instances, the read threshold is modified such that the degraded output corresponds to the stored data set after a defined amount of time in the flash memory. In particular instances, the read back degrade circuit includes a bit erase circuit operable to modify a selected number of bits in the stored data set to correspond to an erase state of the flash memory device.

Yet other embodiments of the present invention provide systems for accessing a flash memory device that include: an auxiliary parity generation circuit, a flash memory write circuit, a flash memory read circuit, a read back degrade circuit, and a data decoder circuit. The auxiliary parity generation circuit is operable to generate an additional parity data for a write data set. The flash memory write circuit is operable to apply a first write signal corresponding to the write data set to a flash memory to yield a stored data set, and the flash memory read circuit operable to read the stored data set from the flash memory. The read back degrade circuit operable to degrade the stored data set to yield a degraded output, and the data decoder circuit is operable to apply a data decoding algorithm to the degraded output using the additional parity data to identify a bit error position in the stored data set. The flash memory write circuit is further operable to apply a second write signal to the flash memory. The second write signal is a modified version of the first write signal that is modified at a location corresponding to the bit error position.

Turning to FIG. 1, a solid state storage device 100 is shown that includes dynamic write circuitry in accordance with other embodiments of the present invention. Solid state storage device 100 includes a host controller circuit 160 that directs read and write access to flash memory cells 140. Flash memory cells 140 may be NAND flash memory cells or another type of solid state memory cells as are known in the art.

A data write is effectuated when host controller circuit 160 provides input data 103 to a primary encoding circuit 164 to yield a write data set 105. The encoding applied by primary encoding circuit 164 yields input data 103 plus additional encoding information that together comprise write data 105. In some cases, such primary encoding may be a low density parity check encoding as is known in the art. Based upon the disclosure provided herein, one of ordinary skill in the art will recognize other encodings that may be applied in accordance with different embodiments of the present invention.

A memory access controller 120 formats write data 105 and provides an address 123 and an encoded write data 125 to a voltage pulsing write circuit 130. Voltage pulsing write circuit 130 provides write voltage pulses 135 corresponding to respective groupings of encoded write data 125 that is used to charge respective flash memory cells addressed by address 123. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '11' | V3 |
| '10' | V2 |
| '00' | V1 |
| '01' | V0 |

Where V3 is greater than V2, V2 is greater than V1, and V1 is greater than V0. The duration and/or magnitude of write voltage pulses 135 is controlled by a pulse control signal 127 provided from memory access controller circuit 120.

Voltage pulsing write circuit 130 applies a pulsed voltage to flash memory cells 140 according to encoded write data 125. The number and duration of the pulses during this initial write process are controlled by pulse control signal 127, and may be selected such that it is close to a complete write of the flash memory, but that would be expected to under program at least some cells of the clash memory. The encoded write data 125 is read back from flash memory cells 140 with the result being a read back data set provided as multi-bit read data 155. This read back data set is similar to the data set that would be read back during a standard read of the flash memory, and thus would be provided to a data decoding circuit if a standard read was being performed.

The read back data set is then purposely degraded by a degraded data processing circuit 186 to yield a degraded data set 184. The degrading process may be any process known in the art that is capable of marginalizing one or more bits of the read back data set. In one particular embodiment of the present invention, the read back data set is marginalized by adjusting read threshold values 156 used by read circuit 150 such that the resulting read data is less accurate (i.e., marginalized). In such cases, read data degrade circuit 180 may be implemented as part of read circuit 150 or in parallel to read circuit 150. Further, in some cases, degraded data processing circuit 186 may be implemented either as part of read circuit 150 or in parallel to read circuit 150. The magnitude of the marginalization may be selected such that the resulting read back data represents a certain amount of flash memory drift that would be expected over time. In some cases, the marginalization applied to the read back data set is greater than an amount of deterioration the flash memory cells will experience during normal operation.

In some cases, the marginalization applied as part of degrading the read back data set may be dynamically selected. In particular, when the flash memory is new, the marginalization may be reduced such that writes early in the life of the flash memory are softened. Such softening reduces the damage to the flash memory due to over programming and thereby increases life expectancy of the flash memory. In contrast, later in the life of the flash memory when greater drift is expected, the marginalization may be increased such that the marginalization more accurately effects a worst case of the flash memory.

In various cases, the marginalization applied as part of degrading the read back data set may be selected with the optimization goal of increasing programming speed of the flash memory. Increasing programming speed can be achieved by using a series of relatively high voltage pulses where the voltage of some cells of flash memory cells 140 will be expected to significantly overshoot a desired target threshold (i.e., over programmed. Alternatively, the marginalization applied as part of degrading the read back data set may be selected with the optimization goal of reducing write stress on the flash memory. Reducing write stress can be achieved by using a series of relatively low voltage pulses where the voltage of some cells of the flash memory will be expected to significantly undershoot a desired target threshold (i.e., under programmed), but the process will operate to control the number of under programmed cells in the flash memory to a correctable level.

A degraded data processing circuit 186 applies a data decoding algorithm to reverse the encoding applied by primary encoding circuit 164 to read data 107. Upon applying the data decoding, degraded data processing circuit 186 generates a bit error rate 188 based upon the number of errors remaining after decoding and bit error rate 188 is provided back to memory access controller circuit 120. In other embodiments, the data decoding process and data degrading processes may be replaced by a less time consuming process of comparing the analog read voltage from read cells with increased read voltage thresholds to determine how many of the cells remain as possible errors, and calculating a bit error rate based upon the percentage of cells that fail when the higher voltage thresholds are used. In such a case, the read data degrade circuit may be incorporated into read circuit 150. The cells that remain as possible errors are those that yield an incorrect digital read output compared with the originally written data when the increased read voltage thresholds are used.

In either case, memory access controller circuit 120 compares bit error rate 188 with an error threshold value 189. The threshold value may be user programmable and is selected to be the bit error rate that can be corrected by a data decoder circuit applying the primary encoding to perform the decoding process. Where bit error rate 188 is less than error threshold value 189, memory access controller circuit 120 ends the write process. Alternatively, where bit error rate 188 is not less than error threshold value 189, memory access controller circuit asserts pulse control signal 127 to cause additional voltage pulses to be applied by voltage pulsing write circuit 130 to increase the programming of the selected cells of flash memory cells 140. The additional voltage pulses may include fewer pulses and/or pulse duration when compared with the pulses done to perform the original write. This process continues until bit error rate 188 goes below threshold 189, at which time the number of errors are correctable by an iterative data processing circuit 170 and memory access controller 120 ends the write process. It should be noted that where degraded data processing circuit 186 applies the data decoding algorithm as iterative data processing circuit 170, that the data decoding circuitry may be shared between degraded data processing circuit 186 and iterative data processing circuit 170.

A data read is effectuated when host controller circuit 160 provides address 110 along with a request to read data from the corresponding location in flash memory cells 140. Memory access controller 120 accesses a read voltage 145 from locations indicated by address 123 and compares the voltage to a number of threshold values to reduce the voltage to a multi-bit read data 155. Using the same two bit example, the following multi-bit read data 155 results:

| Voltage Input | Two Bit Data Output |
|---|---|
| >V2 | '11' |
| >V1 | '10' |
| >V0 | '00' |
| <=V0 | '01' |

This multi-bit read data 155 is provided from memory access controller 120 to iterative data processing circuit 170 as read data 107. Iterative data processing circuit 170 determines whether there are any errors in read data 107. Where there are no errors in read data 107, iterative data processing circuit 170 provides read data 107 as read data 175. It should be noted that the aforementioned table is merely an example, and that different devices may assign different bit values to the different voltage thresholds. For example in other cases the values in the following table may be used:

| Voltage Input | Two Bit Data Output |
|---|---|
| >V2 | '01' |
| >V1 | '00' |
| >V0 | '10' |
| <=V0 | '11' |

Of course, other bit patterns may be assigned to different thresholds.

Where errors remain, iterative data processing circuit 170 generates or accesses soft data corresponding to read data 107. Such soft data indicates a probability that given elements of read data 107 are correct. In some cases, this soft data is provided by read circuit 150 as soft data 154 and indicates a difference between read voltage 145 and a threshold value for the elements of read data 155. This soft information is provided to iterative data processing circuit 170 as soft data 172. In other embodiments of the present invention, the soft data is not available from read circuit 150. In such embodiments, the soft data may be generated. Such generation of soft data may be done using any approach known in the art for generating soft data. As one example, generation of soft data may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application is incorporated herein by reference for all purposes.

Iterative data processing circuit 170 repeatedly applies a data decoding algorithm to read data 107 and soft data 172 to yield a decoded output. In some cases, read data 107 is the same as read data 155 and soft data 172 is the same as soft data 154. Where the decoded output converges (i.e., results in a correction of all remaining errors in read data 107), the decoded output is provided as read data 175. Where the decoded output fails to converge (i.e., errors remain in the decoded output), another iteration of the data decoding algorithm is applied to read data 107 guided by the previous decoded output to yield an updated decoded output. This process continues until either all errors are corrected or a timeout condition occurs (e.g., 100 iterations). In some embodiments of the present invention, the data decoding algorithm is a low density parity check algorithm as is known in the art. It should be noted that while the data processing circuit 170 is disclosed as an iterative processor, that it may be replaced by other types of data processors that are not iterative in nature. Based upon the disclosure provided herein, one of ordinary skill in the art will recognize a variety of data decoding algorithms that may be used in relation to various embodiments of the present invention.

Figure 2:
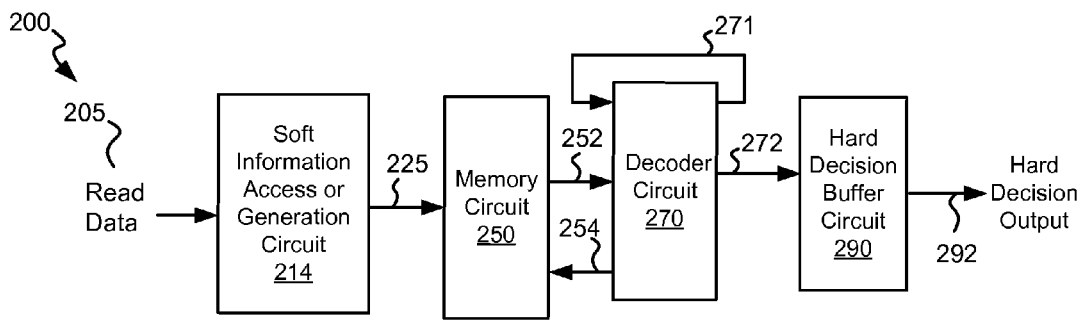
FIG. 2 depicts one implementation of an iterative data processing circuit that may be used in relation to embodiments of the present invention.

Turning to FIG. 2, one implementation of an iterative data processing circuit 200 is shown that may be used in relation to embodiments of the present invention. In particular, iterative data processing circuit 200 may be used to replace iterative data processing circuit 170 and the soft data generation circuitry of read circuit 150 discussed above in relation to FIG. 1. Where iterative data processing circuit 200 is used in place of iterative data processing circuit 170 and the soft data generation circuitry of read circuit 150, read data 155 is used internal to read circuit 150 where it is applied to a soft information access or generation circuit 214 replaces the soft information generation done as part of read circuit 150, and a soft data set 225 is provided as soft data 154 that is connected to soft data input 107. In such a case, read data 107 is not provided to iterative data processing circuit 170. A similar circuit may be used to replace degraded data processing circuit 186 and/or degraded data processing circuit 186 and iterative data processing circuit 170 may share a common decoder circuit 270.

Iterative data processing circuit 200 receives read data input 205. Soft information access or generation circuit 214 is operable to either access soft information corresponding to read data input 205 or to generate soft information corresponding to read data input 205. Such soft information indicates a probability that given elements of read data input 205 are correct. In some cases, this soft information is provided by a solid state memory device as an input (not shown) to soft information access generation circuit 214. In other cases, the soft information is generated. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

Soft information access or generation circuit 214 provides a combination of soft information and read data input 205 to a memory circuit 250 as data set 225. Once decoder circuit 270 is available, a previously stored data set 225 is accessed from memory circuit 250 as a decoder input 252. In some embodiments of the present invention, the decoder circuit 270 is a low density parity check decoder circuit as is known in the art. Based upon the disclosure provided herein, one of ordinary skill in the art will recognize a variety of decoder circuits that may be used in relation to various embodiments of the present invention.

Decoder circuit 270 applies a data decoding algorithm to decoder input 252 to yield a decoded output 271. Where decoded output 271 fails to converge (i.e., decoded output 271 includes errors), another iteration of the data decoding algorithm is applied to decoder input 252 guided by decoded output 271. This process is repeated until either decoded output 271 converges (i.e., is error free) or a maximum number of iterations are performed condition is met. Alternatively, where decoded output 271 converges, it is provided as a decoded output 272 to a hard decision buffer circuit 290. Hard decision buffer circuit 290 provides the hard decisions of decoded output 272 as a hard decision output 292.

Figure 3A:
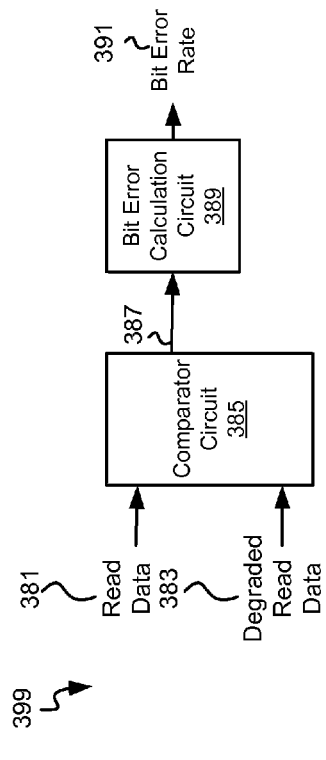
FIG. 3a shows one implementation of a degraded data processing circuit in accordance with some embodiments of the present invention.

Turning to FIG. 3a, a comparator based bit error rate calculation circuit 399 is shown that may be used in accordance with various embodiments of the present invention. Comparator based bit error rate calculation circuit 399 may be used in place of degraded data processing circuit 186 of FIG. 1. Comparator based bit error rate calculation circuit 399 includes a comparator circuit 385 that compares read data 381 with degraded read data 383. Degraded read data 383 corresponds to degraded data set 184 and read data 381 corresponds to write data 105 of FIG. 1. Comparator circuit 385 calculates a total number of incorrect bit positions based upon comparing the received data sets. This total number of incorrect bit positions provided as an error output 387 to a bit error calculation circuit 389. Bit error calculation circuit 389 converts error output 387 to a bit error rate 391. In one particular embodiment of the present invention, bit error rate 391 is calculated as the percentage of error output 387 to a total number of bit positions compared (i.e., a percentage of bit errors). Bit error rate 391 may be used as bit error rate 188 of FIG. 1 that is compared to error threshold value 189.

Figure 3B:
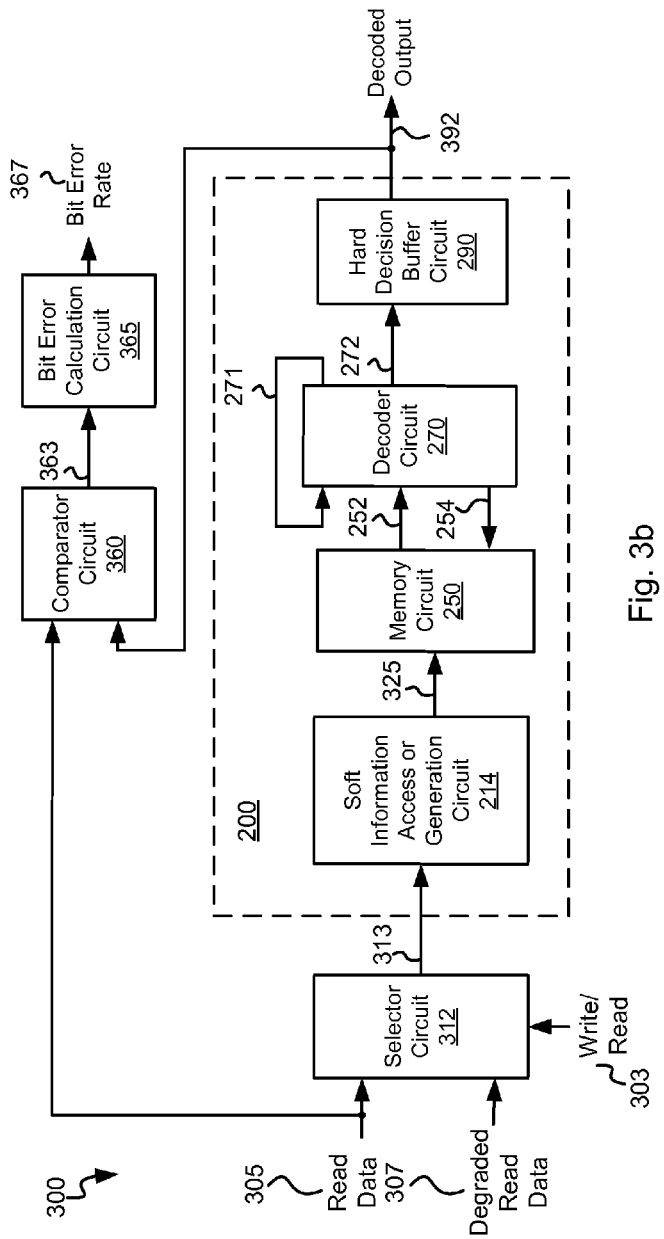
FIG. 3b depicts another implementation of a degraded data processing circuit in accordance with some embodiments of the present invention.

Turning to FIG. 3b, a decoder based bit error rate calculation circuit 300 is shown that may be used in accordance with various embodiments of the present invention. Decoder based bit error rate calculation circuit 300 may be used in place of degraded data processing circuit 186 of FIG. 1. Decoder based bit error rate calculation circuit 300 includes iterative data processing circuit 200 described above in relation to FIG. 2 and shown in dashed lines, a selector circuit 312, a comparator circuit 360, and a bit error calculation circuit 365. In operation, during a write function indicated by a write/read input 303, selector circuit 312 selects degraded read data 307 as a decoder input 313. Degraded read data 307 corresponds to degraded data set 184 of FIG. 1. Alternatively, during a read function indicated by a write/read input 303, selector circuit 312 selects read data 305 as decoder input 313. Read data 305 corresponds to read data 107 of FIG. 1 during a read or to write data 105 during a write operation.

Data decoder circuit 200 applies the data decoding algorithm to decoder input 313 to yield a decoded output 392. Decoded output 392 is compared with the original written data set (i.e., write data 105) by comparator circuit 360. Comparator circuit 360 calculates a total number of incorrect bit positions based upon comparing the received data sets. This total number of incorrect bit positions provided as an error output 363 to a bit error calculation circuit 3865 Bit error calculation circuit 365 converts error output 363 to a bit error rate 367. In one particular embodiment of the present invention, bit error rate 367 is calculated as the percentage of error output 363 to a total number of bit positions compared (i.e., a percentage of bit errors). Bit error rate 367 may be used as bit error rate 188 of FIG. 1 that is compared to error threshold value 189.

Figure 4A:
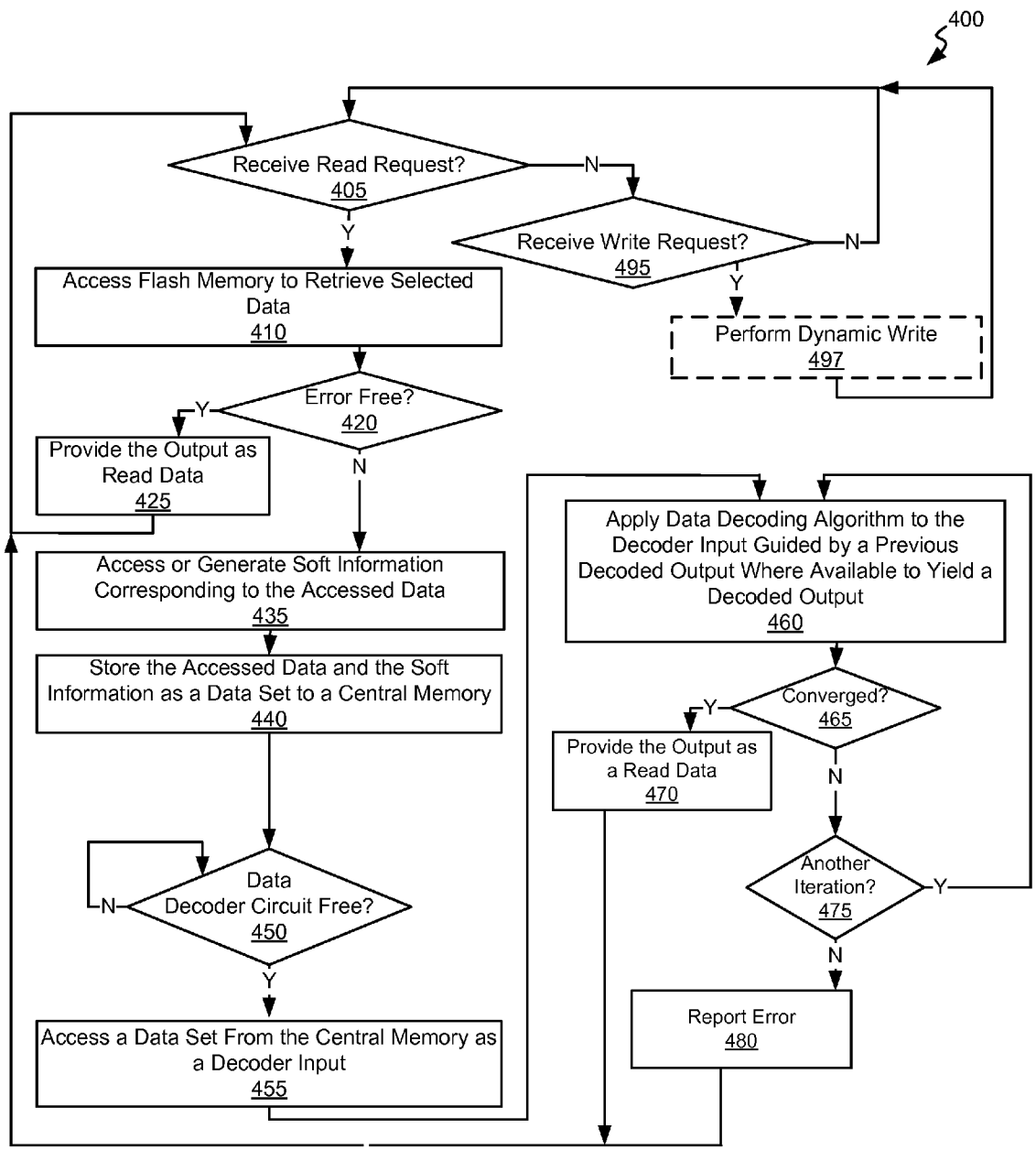
FIGS. 4a-4b are flow diagrams are flow diagrams show a method for flash memory access using data degrade read back during a write operation in accordance with various embodiments of the present invention.
Figure 4B:
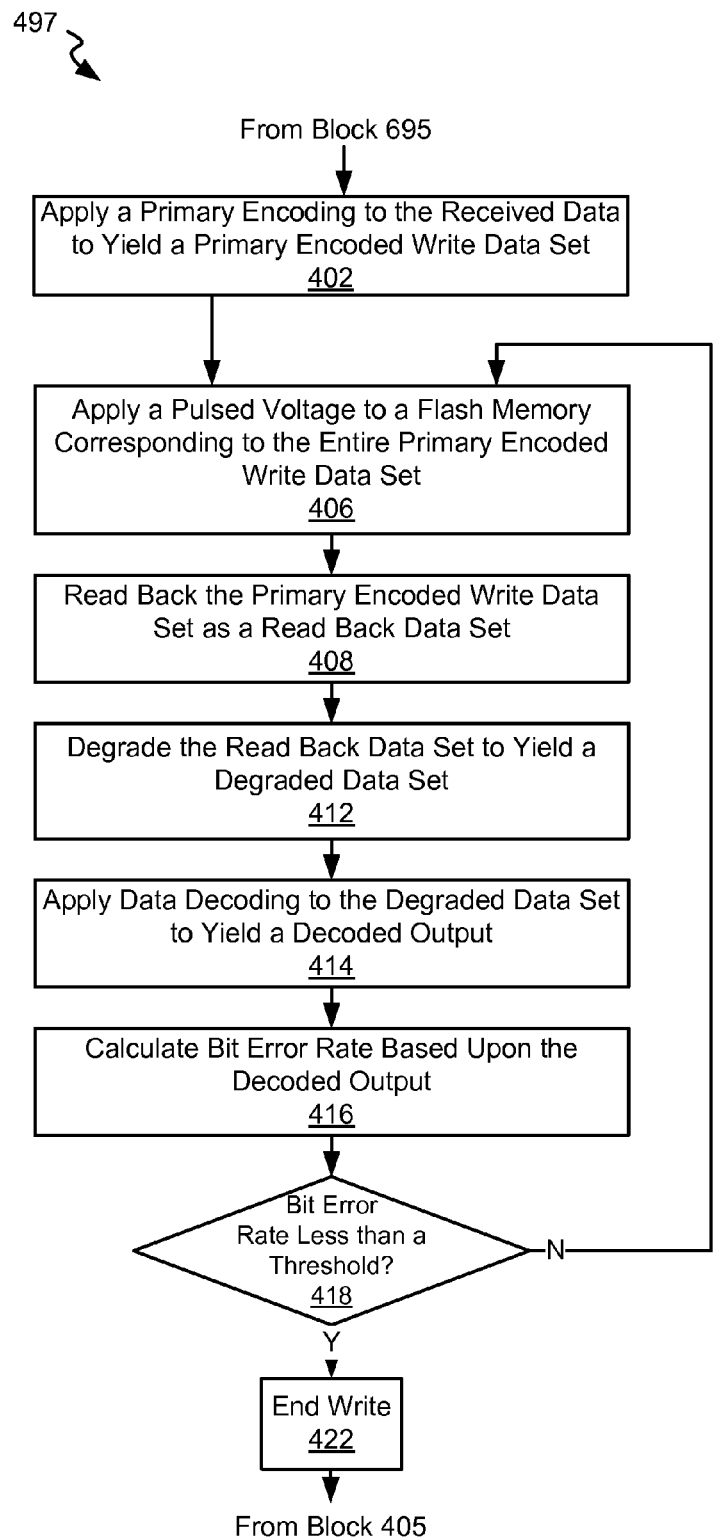

Turning to FIGS. 4a-4b, flow diagrams 400,497 show a method for flash memory access using data degrade read back during a write operation in accordance with various embodiments of the present invention. Following flow diagram 400 of FIG. 4a, it is determined whether a read request is received (block 405). Where a read request is not received (block 405), it is determined whether a write request has been received (block 495). Where a write request is received (block 495), data received is formatted and written to a location in the flash memory indicated by an address received as part of the write request. This write process is a dynamic write utilizing data degrade read back in accordance with some embodiments of the present invention (block 497). The write process is shown in dashed lines and is shown in more detail in relation to FIG. 4b. Once the write completes, the process returns to block 405.

Alternatively, when a read access is received (block 405), it includes an address indicating a location from which the data is to be accessed. Data is then accessed from the flash memory at the location indicated by the read request (block 410). It is determined whether the retrieved data is error free (block 420). Where it is determined that the data is error free (block 420), the retrieved data is provided as read data (block 425), and the process returns to block 405. Otherwise, where it is not determined that the data is error free (block 420), soft information corresponding to the accessed data is either accessed or generated (block 435). Such soft information indicates a probability that given elements of the accessed data are correct. In some cases, this soft information is provided by a solid state memory device from which the data was accessed. In other cases, the soft information is generated. Such generation of soft information may be done using any approach known in the art for generating soft data. As one example, generation of soft information may be done similar to that disclosed in U.S. patent application Ser. No. 14/047, 423 entitled "Systems and Methods for Enhanced Data Recovery in a Solid State Memory System", and filed by Xia et al. on Oct. 7, 2013. The entirety of the aforementioned application was previously incorporated herein by reference for all purposes.

The accessed data and the corresponding soft information is stored as a data set to a central memory (block 440). It is then determined whether the data decoder circuit is available for processing (block 450). Where the data decoder circuit is available for processing (block 450), a previously stored data set is accessed from the central memory as a decoder input (block 455). A data decoding algorithm is applied to the accessed data set to yield a decoded output (block 460). Where available (i.e., for the second and later iterations), a previous decoded output is used to guide application of the data decoding algorithm. In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention. It is determined whether the decoded output converged (block 465). Where it is determined that the decoded output converged (block 465), the decoded output is provided as read data (block 470), and the process returns to block 405.

Alternatively, where it is determined that the decoded output failed to converge (block 465). It is determined whether another iteration of the data decoding algorithm is allowed (block 475). In some cases, a maximum number of iterations of the data decoding algorithm is fixed or programmable. This is effectively a timeout condition. In some cases, the maximum number of allowable iterations of the data decoding algorithm is one hundred. Based upon the disclosure provided herein, one of ordinary skill in the art will recognize other numbers of iterations that may be allowed in relation to different embodiments of the present invention. Where another local iteration is not allowed (block 475), an error is indicated (block 480) and the process returns to block 405. Otherwise, where another iteration of the decoding algorithm is allowed (block 475), the processes of blocks 460-675 are repeated.

Turning to FIG. 4b and following flow diagram 497 that corresponds to block 497 of FIG. 4a, primary encoding is applied to the data set that is to be written to the flash memory (block 402). This primary encoding yields the original write data set plus additional encoding information that together comprise a primary encoded write data set. In some cases, such primary encoding may be a low density parity check encoding as is known in the art. Based upon the disclosure provided herein, one of ordinary skill in the art will recognize other encodings that may be applied in accordance with different embodiments of the present invention.

A pulsed voltage is applied to a flash memory corresponding to the entire primary encoded write data set (block 406). The number and duration of the pulses during this initial write process may be selected such that it is close to a complete write of the flash memory, but that would be expected to under program at least some cells of the clash memory. The primary encoded write data set is read back from the flash memory with the result being a read back data set (block 408). This read back data set is similar to the data set that would be read back during a standard read of the flash memory, and thus would be provided to a data decoding circuit if a standard read was being performed.

The read back data set is purposely degraded to yield a degraded data set (block 412). The degrading process may be any process known in the art that is capable of marginalizing one or more bits of the read back data set. In one particular embodiment of the present invention, the read back data set is marginalized by adjusting the threshold values used by a read circuit such that the resulting read data is less accurate (i.e., marginalized). In other embodiments, the marginalization may include deliberating erasing a selected number of bits of the read back data as part of applying a data decode process and/or by limiting the number of iterations that a data decoder circuit is allowed to apply to the read back data. Based upon the disclosure provided herein, one of ordinary skill in the art will recognize a variety of other approaches that may be used to degrade the read back data in accordance with different embodiments of the present invention. The magnitude of the marginalization may be selected such that the resulting read back data represents a certain amount of flash memory drift that would be expected over time. In some cases, the marginalization applied to the read back data set is greater than an amount of deterioration the flash memory cells will experience during normal operation.

In some cases, the marginalization applied as part of degrading the read back data set may be dynamically selected. In particular, when the flash memory is new, the marginalization may be reduced such that writes early in the life of the flash memory are softened. Such softening reduces the damage to the flash memory due to over programming and thereby increases life expectancy of the flash memory. In contrast, later in the life of the flash memory when greater drift is expected, the marginalization may be increased such that the marginalization more accurately effects a worst case of the flash memory.

In various cases, the marginalization applied as part of degrading the read back data set may be selected with the optimization goal of increasing programming speed of the flash memory. Increasing programming speed can be achieved by using a series of relatively high voltage pulses where the voltage of some cells of the flash memory will be expected to significantly overshoot a desired target threshold (i.e., over programmed). Alternatively, the marginalization applied as part of degrading the read back data set may be selected with the optimization goal of reducing write stress on the flash memory. Reducing write stress can be achieved by using a series of relatively low voltage pulses where the voltage of some cells of the flash memory will be expected to significantly undershoot a desired target threshold (i.e., under programmed), but the process will operate to control the number of under programmed cells in the flash memory to a correctable level.

Data decoding is applied to the degraded data set to yield a decoded output (block 414). Where the primary encoding is a low density parity check encoding, then the data decoding is a corresponding low density parity check decoding as is known in the art. A bit error rate is calculated based upon a number of errors remaining in the decoded output (block 416). In other embodiments, the data decoding process and data degrading processes may be replaced by a less time consuming process of comparing the analog read voltage from read cells with increased read voltage thresholds to determine how many of the cells remain as possible errors, and calculating a bit error rate based upon the percentage of cells that fail when the higher voltage thresholds are used. The cells that remain as possible errors are those that yield an incorrect digital read output compared with the originally written data when the increased read voltage thresholds are used.

In either case, the calculated bit error rate is compared with a threshold value (block 418). The threshold value is selected to be the bit error rate that can be corrected by a data decoder circuit applying the primary encoding to perform the decoding process. Where the bit error rate is less than the threshold value (block 418), the write process is ended as the data set is sufficiently programmed to compensate for any expected drift in the flash memory (block 422). Alternatively, where the bit error rate is not less than the threshold value (block 418), the processes of blocks 406-418 are re-performed to add additional programming pulses such that the bit error rate is reduced. The second and later times that the pulsed voltage is applied in block 406, the number and/or duration of the pulses may be changed to reflect the reduced amount of programming that remains.

Figure 5:
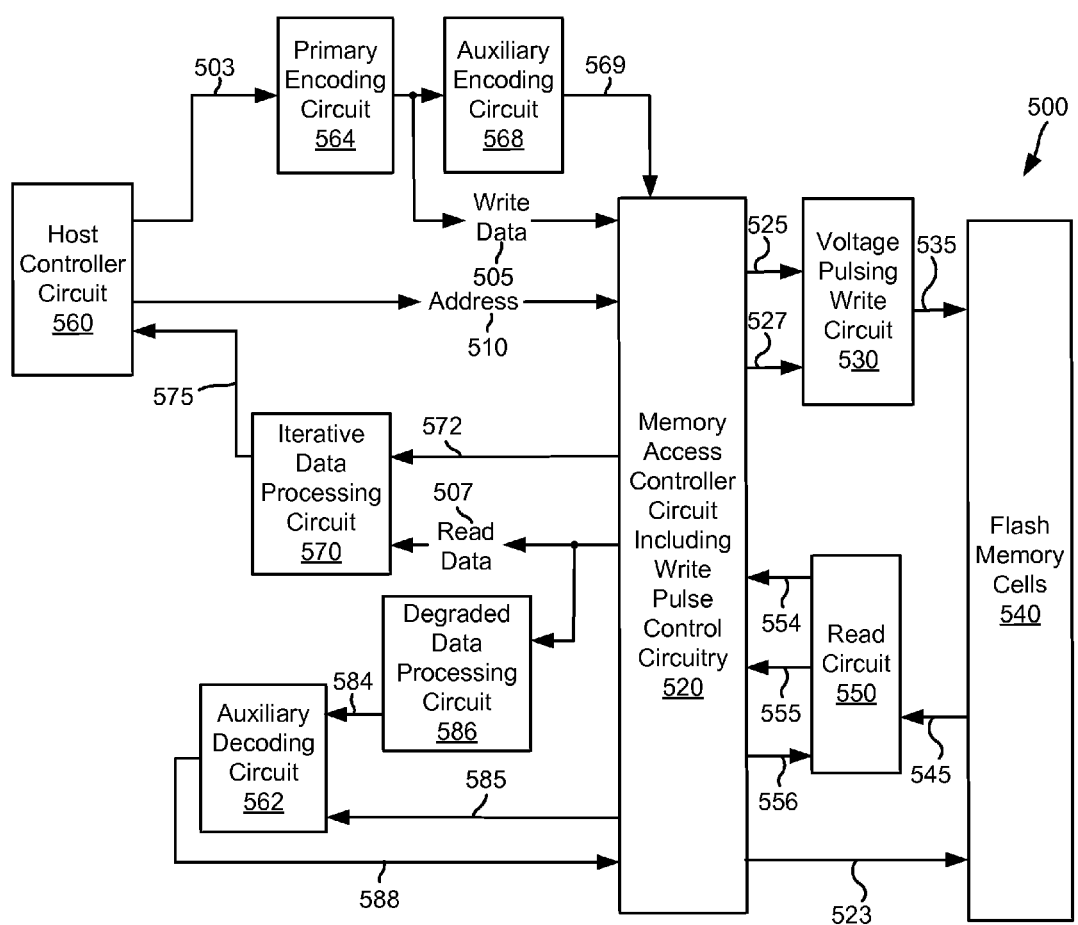
FIG. 5 depicts another solid state storage device including dynamic write circuitry in accordance with other embodiments of the present invention.

Turning to FIG. 5, another solid state storage device 500 is shown that includes dynamic write circuitry in accordance with other embodiments of the present invention. Solid state storage device 500 includes a host controller circuit 560 that directs read and write access to flash memory cells 540. Flash memory cells 540 may be NAND flash memory cells or another type of solid state memory cells as are known in the art.

A data write is effectuated when host controller circuit 560 provides input data 503 to a primary encoding circuit 564 to yield a write data set 505. The encoding applied by primary encoding circuit 564 yields input data 503 plus additional encoding information that together comprise write data 505. In some cases, such primary encoding may be a low density parity check encoding as is known in the art. Based upon the disclosure provided herein, one of ordinary skill in the art will recognize other encodings that may be applied in accordance with different embodiments of the present invention.

A memory access controller 520 formats write data 505 and provides an address 523 and an encoded write data 525 to a voltage pulsing write circuit 530. Voltage pulsing write circuit 530 provides write voltage pulses 535 corresponding to respective groupings of encoded write data 525 that is used to charge respective flash memory cells addressed by address 523. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '11' | V3 |
| '10' | V2 |
| '00' | V1 |
| '01' | V0 |

Where V3 is greater than V2, V2 is greater than V1, and V1 is greater than V0. The duration and/or magnitude of write voltage pulses 535 is controlled by a pulse control signal 527 provided from memory access controller circuit 520.

An auxiliary encoding circuit 568 receives write data 505 and applies an auxiliary encoding algorithm to yield a temporary encoded output 569. Temporary encoded output 569 is provided to memory access controller circuit 520 where it is stored. The circuit to generate the temporary encoded output and/or to store the temporary encoded output may be implemented as part of a flash memory die or in a controller for the flash memory. The temporary encoded output, as described below, is used to identify problematic bit positions in the primary encoded write data set. The auxiliary encoding may be any encoding known in the art. As just one example, the auxiliary encoding may be a parity based encoding algorithm that is used to identify the locations of a defined number of errors in a decoded result. Based upon the disclosure provided herein, one of ordinary skill in the art will recognize a variety of encoding algorithms that may be used to perform the auxiliary encoding.

Voltage pulsing write circuit 530 applies a pulsed voltage to flash memory cells 540 according to encoded write data 525. The number and duration of the pulses during this initial write process are controlled by pulse control signal 527, and may be selected such that it is close to a complete write of the flash memory, but that would be expected to under program at least some cells of the clash memory. The encoded write data 525 is read back from flash memory cells 540 with the result being a read back data set provided as multi-bit read data 555. This read back data set is similar to the data set that would be read back during a standard read of the flash memory, and thus would be provided to a data decoding circuit if a standard read was being performed.

The read back data set is purposely degraded by a read data degrade circuit 580 to yield a degraded data set 584. The degrading process may be any process known in the art that is capable of marginalizing one or more bits of the read back data set. In one particular embodiment of the present invention, the read back data set is marginalized by adjusting read threshold values 556 used by read circuit 550 such that the resulting read data is less accurate (i.e., marginalized). The magnitude of the marginalization may be selected such that the resulting read back data represents a certain amount of flash memory drift that would be expected over time. In some cases, the marginalization applied to the read back data set is greater than an amount of deterioration the flash memory cells will experience during normal operation.

In some cases, the marginalization applied as part of degrading the read back data set may be dynamically selected. In particular, when the flash memory is new, the marginalization may be reduced such that writes early in the life of the flash memory are softened. Such softening reduces the damage to the flash memory due to over programming and thereby increases life expectancy of the flash memory. In contrast, later in the life of the flash memory when greater drift is expected, the marginalization may be increased such that the marginalization more accurately effects a worst case of the flash memory.

In various cases, the marginalization applied as part of degrading the read back data set may be selected with the optimization goal of increasing programming speed of the flash memory. Increasing programming speed can be achieved by using a series of relatively high voltage pulses where the voltage of some cells of flash memory cells 540 will be expected to significantly overshoot a desired target threshold (i.e., over programmed. Alternatively, the marginalization applied as part of degrading the read back data set may be selected with the optimization goal of reducing write stress on the flash memory. Reducing write stress can be achieved by using a series of relatively low voltage pulses where the voltage of some cells of the flash memory will be expected to significantly undershoot a desired target threshold (i.e., under programmed), but the process will operate to control the number of under programmed cells in the flash memory to a correctable level.

An auxiliary decoding circuit 562 applies a data decoding algorithm to reverse the encoding applied by auxiliary encoding circuit 568 to a combination of read data 507 (i.e., multi-bit read data 555 passed through by memory access controller circuit 520) and temporary encoded output 585 (i.e., temporary encoded output 569 passed through by memory access controller circuit 520). Upon applying the data decoding, auxiliary decoding circuit 562 provides an error location output 588 to memory access controller circuit 520. Error location output 588 identifies the locations within read data 507 that are incorrect.

Memory access controller circuit 520 determines whether the number of remaining errors is less than a threshold value. Where the number of remaining errors is less than a threshold value, the write process is completed. The threshold value is selected as the number of errors that can be corrected by an iterative data processing circuit 570. Where the write process ends, temporary encoded output 569 that was previously stored by memory access controller circuit 520 can be discarded.

Alternatively, where the number of remaining errors is not less than the threshold value, memory access controller circuit 520 provides additional processing to compensate for errors at the locations identified by error location output 588. This may be done in one of a variety of ways. For example, the write thresholds may be modified to apply additional programming (i.e., higher voltage thresholds) for the locations corresponding to the remaining errors identified subset of the entire primary encoded write data set, and then additional voltage pulses including higher voltages corresponding to the locations of the remaining errors are applied to the flash memory to finish the write. The aforementioned may be accomplished by asserting pulse control signal 527 to apply the additional programming to the problematic areas of flash memory cells 540. As another example, memory access controller circuit 520 may restart the write process with a write to a different block of flash memory cells 540. As yet another example, the locations of the remaining errors indicated by error location output 588 may be stored by memory access controller circuit 520 (perhaps in flash memory cells 540) for use in relation to correcting read back data as part of applying the data decoding using the primary encoding. The temporary encoded output is then discarded and the write process ends.

A data read is effectuated when host controller circuit 560 provides address 510 along with a request to read data from the corresponding location in flash memory cells 540. Memory access controller 520 accesses a read voltage 545 from locations indicated by address 123 and compares the voltage to a number of threshold values to reduce the voltage to a multi-bit read data 555. Using the same two bit example, the following multi-bit read data 555 results:

| Voltage Input | Two Bit Data Output |
|---|---|
| >V2 | '11' |
| >V1 | '10' |
| >V0 | '00' |
| <=V0 | '01' |

This multi-bit read data 555 is provided from memory access controller 520 to iterative data processing circuit 570 as read data 507. Iterative data processing circuit 570 determines whether there are any errors in read data 507. Where there are no errors in read data 507, iterative data processing circuit 570 provides read data 507 as read data 575. It should be noted that the aforementioned table is merely an example, and that different devices may assign different bit values to the different voltage thresholds. For example in other cases the values in the following table may be used:

| Voltage Input | Two Bit Data Output |
|---|---|
| >V2 | '01' |
| >V1 | '00' |
| >V0 | '10' |
| <=V0 | '11' |

Of course, other bit patterns may be assigned to different thresholds.

Where errors remain, iterative data processing circuit 570 generates or accesses soft data corresponding to read data 507. Such soft data indicates a probability that given elements of read data 507 are correct. In some cases, this soft data is provided by read circuit 550 as soft data 554 and indicates a difference between read voltage 545 and a threshold value for the elements of read data 555. This soft information is provided to iterative data processing circuit 570 as soft data 572. In other embodiments of the present invention, the soft data is not available from read circuit 550. In such embodiments, the soft data may be generated. Such generation of soft data may be done using any approach known in the art for generating soft data. As one example, generation of soft data may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application is incorporated herein by reference for all purposes.

Iterative data processing circuit 570 repeatedly applies a data decoding algorithm to read data 507 and soft data 572 to yield a decoded output. Where the decoded output converges (i.e., results in a correction of all remaining errors in read data 507), the decoded output is provided as read data 575. Where the decoded output fails to converge (i.e., errors remain in the decoded output), another iteration of the data decoding algorithm is applied to read data 507 guided by the previous decoded output to yield an updated decoded output. This process continues until either all errors are corrected or a timeout condition occurs (e.g., 100 iterations). In some embodiments of the present invention, the data decoding algorithm is a low density parity check algorithm as is known in the art. Based upon the disclosure provided herein, one of ordinary skill in the art will recognize a variety of data decoding algorithms that may be used in relation to various embodiments of the present invention.

Figure 6A:
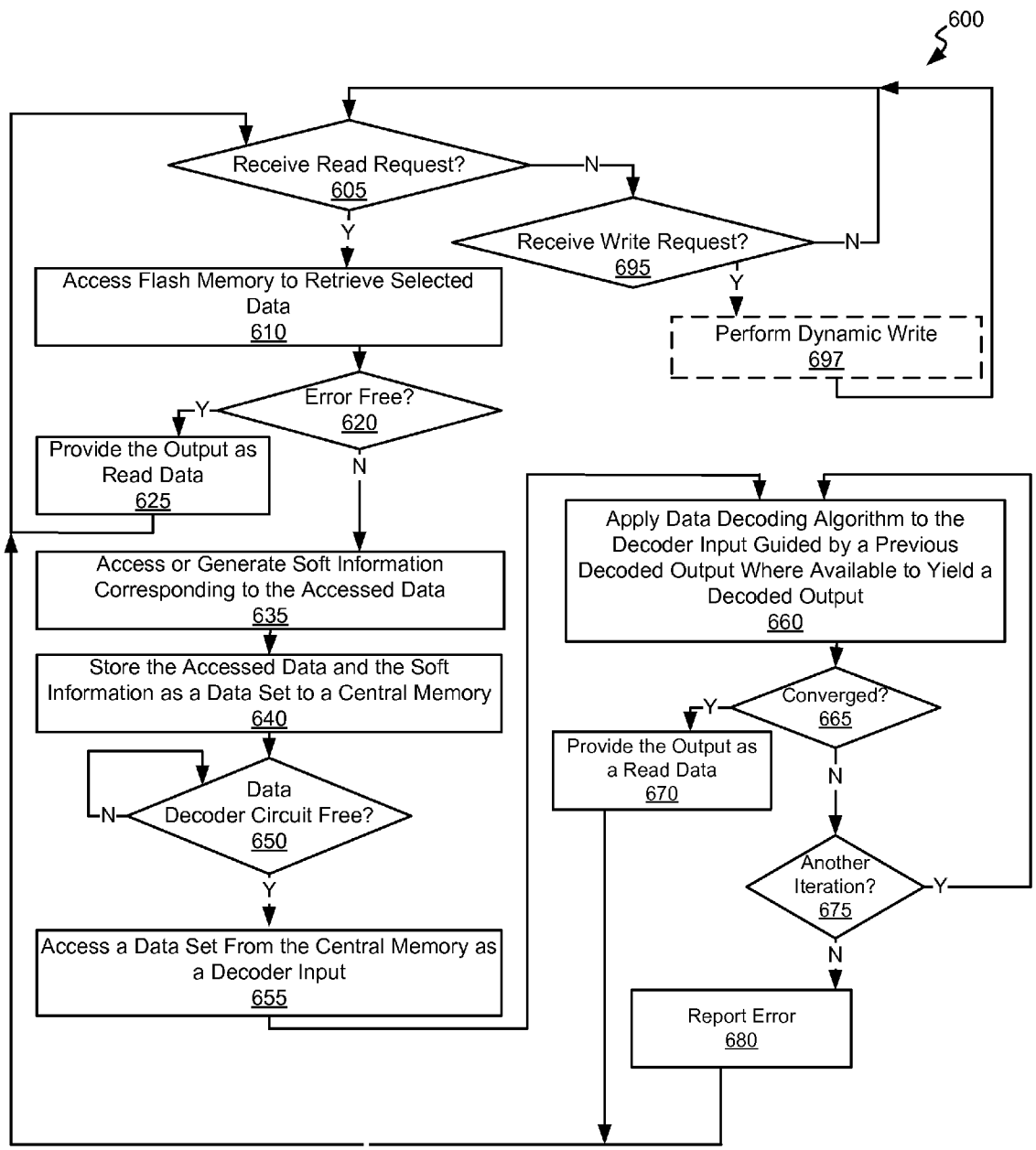
FIGS. 6a-6b are flow diagrams show another method for flash memory access using data degrade read back during a write operation in accordance with various embodiments of the present invention.
Figure 6B:
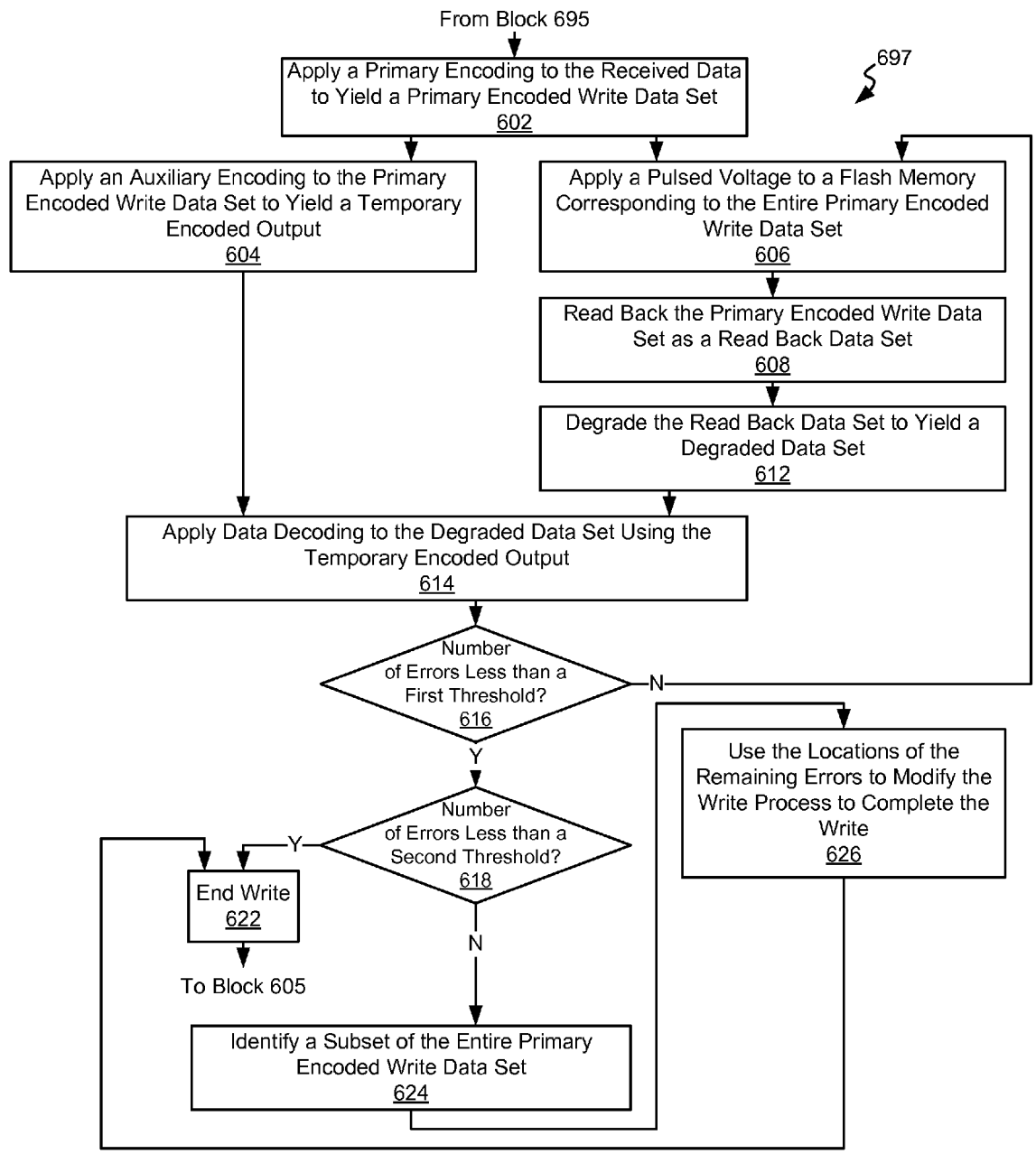

Turning to FIGS. 6a-6b, flow diagrams 600,697 show a method for flash memory access using data degrade read back during a write operation in accordance with various embodiments of the present invention. Following flow diagram 600 of FIG. 6a, it is determined whether a read request is received (block 605). Where a read request is not received (block 605), it is determined whether a write request has been received (block 695). Where a write request is received (block 695), data received is formatted and written to a location in the flash memory indicated by an address received as part of the write request. This write process is a dynamic write utilizing data degrade read back in accordance with some embodiments of the present invention (block 697). The write process is shown in dashed lines and is shown in more detail in relation to FIG. 6b. Once the write completes, the process returns to block 605.

Alternatively, when a read access is received (block 605), it includes an address indicating a location from which the data is to be accessed. Data is then accessed from the flash memory at the location indicated by the read request (block 610). It is determined whether the retrieved data is error free (block 620). Where it is determined that the data is error free (block 620), the retrieved data is provided as read data (block 625), and the process returns to block 605. Otherwise, where it is not determined that the data is error free (block 620), soft information corresponding to the accessed data is either accessed or generated (block 635). Such soft information indicates a probability that given elements of the accessed data are correct. In some cases, this soft information is provided by a solid state memory device from which the data was accessed. In other cases, the soft information is generated. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

The accessed data and the corresponding soft information is stored as a data set to a central memory (block 640). It is then determined whether the data decoder circuit is available for processing (block 650). Where the data decoder circuit is available for processing (block 650), a previously stored data set is accessed from the central memory as a decoder input (block 655). A data decoding algorithm is applied to the accessed data set to yield a decoded output (block 660). Where available (i.e., for the second and later iterations), a previous decoded output is used to guide application of the data decoding algorithm. In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention. It is determined whether the decoded output converged (block 665). Where it is determined that the decoded output converged (block 665), the decoded output is provided as read data (block 670), and the process returns to block 605.

Alternatively, where it is determined that the decoded output failed to converge (block 665). It is determined whether another iteration of the data decoding algorithm is allowed (block 675). In some cases, a maximum number of iterations of the data decoding algorithm is fixed or programmable. This is effectively a timeout condition. In some cases, the maximum number of allowable iterations of the data decoding algorithm is one hundred. Based upon the disclosure provided herein, one of ordinary skill in the art will recognize other numbers of iterations that may be allowed in relation to different embodiments of the present invention. Where another local iteration is not allowed (block 675), an error is indicated (block 680) and the process returns to block 605. Otherwise, where another iteration of the decoding algorithm is allowed (block 675), the processes of blocks 660-675 are repeated.

Turning to FIG. 6b and following flow diagram 697 that corresponds to block 697 of FIG. 6a, primary encoding is applied to the data set that is to be written to the flash memory (block 602). This primary encoding yields the original write data set plus additional encoding information that together comprise a primary encoded write data set. In some cases, such primary encoding may be a low density parity check encoding as is known in the art. Based upon the disclosure provided herein, one of ordinary skill in the art will recognize other encodings that may be applied in accordance with different embodiments of the present invention.

An auxiliary encoding is then applied to the primary encoded write data set to yield a temporary encoded output (block 604). The circuit to generate the temporary encoded output and/or to store the temporary encoded output may be implemented as part of a flash memory die or in a controller for the flash memory. The temporary encoded output, as described below, is used to identify problematic bit positions in the primary encoded write data set. The auxiliary encoding may be any encoding known in the art. As just one example, the auxiliary encoding may be a parity based encoding algorithm that is used to identify the locations of a defined number of errors in a decoded result. Based upon the disclosure provided herein, one of ordinary skill in the art will recognize a variety of encoding algorithms that may be used to perform the auxiliary encoding.

In parallel, a pulsed voltage is applied to a flash memory corresponding to the entire primary encoded write data set (block 606). The number and duration of the pulses during this initial write process may be selected such that it is close to a complete write of the flash memory, but that would be expected to under program at least some cells of the clash memory. The primary encoded write data set is read back from the flash memory with the result being a read back data set (block 608). This read back data set is similar to the data set that would be read back during a standard read of the flash memory, and thus would be provided to a data decoding circuit if a standard read was being performed.

The read back data set is then purposely degraded to yield a degraded data set (block 612). The degrading process may be any process known in the art that is capable of marginalizing one or more bits of the read back data set. In one particular embodiment of the present invention, the read back data set is marginalized by adjusting the threshold values used by a read circuit such that the resulting read data is less accurate (i.e., marginalized). The magnitude of the marginalization may be selected such that the resulting read back data represents a certain amount of flash memory drift that would be expected over time. In some cases, the marginalization applied to the read back data set is greater than an amount of deterioration the flash memory cells will experience during normal operation.

In some cases, the marginalization applied as part of degrading the read back data set may be dynamically selected. In particular, when the flash memory is new, the marginalization may be reduced such that writes early in the life of the flash memory are softened. Such softening reduces the damage to the flash memory due to over programming and thereby increases life expectancy of the flash memory. In contrast, later in the life of the flash memory when greater drift is expected, the marginalization may be increased such that the marginalization more accurately effects a worst case of the flash memory.

In various cases, the marginalization applied as part of degrading the read back data set may be selected with the optimization goal of increasing programming speed of the flash memory. Increasing programming speed can be achieved by using a series of relatively high voltage pulses where the voltage of some cells of the flash memory will be expected to significantly overshoot a desired target threshold (i.e., over programmed. Alternatively, the marginalization applied as part of degrading the read back data set may be selected with the optimization goal of reducing write stress on the flash memory. Reducing write stress can be achieved by using a series of relatively low voltage pulses where the voltage of some cells of the flash memory will be expected to significantly undershoot a desired target threshold (i.e., under programmed), but the process will operate to control the number of under programmed cells in the flash memory to a correctable level.

Data decoding is applied to the degraded data set to yield a temporary decoded output (block 614). It is determined whether the number of errors remaining in the temporary decoded output is less than a first threshold (block 616). The first threshold is selected to be the number of errors that can be uniquely located using the temporary encoded output. Where the number of remaining errors is not less than the first threshold (block 616), the processes of blocks 606-616 are repeated to apply additional voltage pulses and thus further write the flash memory with the data set corresponding to the entire primary encoded write data set. Alternatively, rather than performing another global write to all cells of the primary encoded write data set, additional auxiliary parity (i.e., in addition to the temporary encoded output) may be computed such that the first threshold may be lowered and thus the process may continue past block 616.

Alternatively, where the number of remaining errors is less than the first threshold (block 616), it is determined whether the number of remaining errors is less than a second threshold (block 618). The second threshold is selected to be the number of errors that can be corrected by a data decoder circuit applying the primary encoding to perform the decoding process. Where the number of remaining errors is less than a second threshold (block 618), the temporary encoded output is then discarded and the write process is ended as the data set is sufficiently programmed to compensate for any expected drift in the flash memory (block 622).

Alternatively, where the number of remaining errors is not less than the second threshold (block 618), the location of the remaining errors are identified as a subset of the entire primary encoded write data set (block 624). The locations of the remaining errors are used to modify the write process to complete the write (block 626). This may be done in one of a variety of ways. For example, the write thresholds may be modified to apply additional programming (i.e., higher voltage thresholds) for the locations corresponding to the remaining errors identified subset of the entire primary encoded write data set, and then additional voltage pulses including higher voltages corresponding to the locations of the remaining errors are applied to the flash memory to finish the write. As another example, the process may be restarted with a write to a different block of the flash memory. As yet another example, the locations of the remaining errors may be logged for use in relation to correcting read back data as part of applying the data decoding using the primary encoding. The temporary encoded output is then discarded and the write process ends (block 622).

Figure 7:
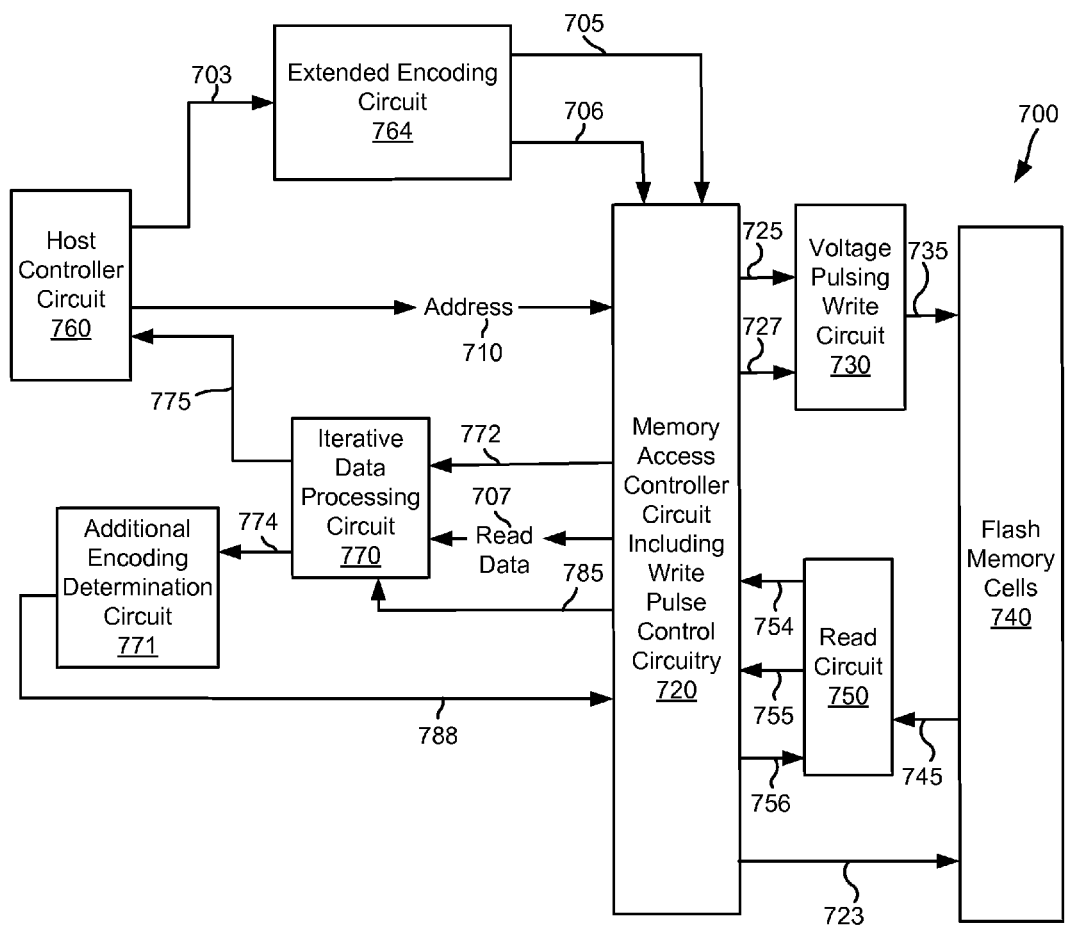
FIG. 7 depicts another solid state storage device including dynamic write circuitry in accordance with one or more embodiments of the present invention.

Turning to FIG. 7, another solid state storage device 700 including dynamic write circuitry in accordance with one or more embodiments of the present invention. Solid state storage device 700 includes a host controller circuit 760 that directs read and write access to flash memory cells 740. Flash memory cells 740 may be NAND flash memory cells or another type of solid state memory cells as are known in the art.

A data write is effectuated when host controller circuit 760 provides input data 703 to an extended encoding circuit 764 to yield a write data set 705. The encoding applied by extended encoding circuit 764 yields input data 703 plus a first set of encoding data that together comprise write data 705, and a second set of encoding data 706. The first set of encoding data is that encoding data that would be expected to be written to flash memory cells under non-error operating conditions, and the second set of encoding data is additional encoding data that may be written in the event an error is determined. The second set of encoding data may be later used to correct errors beyond those addressable using just the first set of encoding data. In some cases, the encoding applied by extended encoding circuit 764 may be a low density parity check encoding as is known in the art. Based upon the disclosure provided herein, one of ordinary skill in the art will recognize other encodings that may be applied in accordance with different embodiments of the present invention.

A memory access controller 720 formats write data 705 and provides an address 723 and an encoded write data 725 to a voltage pulsing write circuit 730. Voltage pulsing write circuit 730 provides write voltage pulses 735 corresponding to respective groupings of encoded write data 725 that is used to charge respective flash memory cells addressed by address 723. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '11' | V3 |
| '10' | V2 |
| '00' | V1 |
| '01' | V0 |

Where V3 is greater than V2, V2 is greater than V1, and V1 is greater than V0. The duration and/or magnitude of write voltage pulses 735 is controlled by a pulse control signal 727 provided from memory access controller circuit 720.

Voltage pulsing write circuit 730 applies a pulsed voltage to flash memory cells 740 according to encoded write data 725. The number and duration of the pulses during this initial write process are controlled by pulse control signal 727, and may be selected such that it is expected to result in a complete write of flash memory cells 740. The encoded write data 725 is read back from flash memory cells 740 with the result being a read back data set provided as multi-bit read data 755. The read back data set is similar to the data set that would be read back during a standard read of the flash memory, and thus would be provided to a data decoding circuit if a standard read was being performed. Such a read back is effectuated by memory access controller 720 re-accessing the previously written data from flash memory cells 740. This includes comparing a read voltage 745 from locations indicated by address 723 to a number of threshold values to reduce the voltage to a multi-bit read data 755. Using the same two bit example, the following multi-bit read data 755 results:

| Voltage Input | Two Bit Data Output |
|---|---|
| >V2 | '11' |
| >V1 | '10' |
| >V0 | '00' |
| <=V0 | '01' |

This multi-bit read data 755 is provided from memory access controller 720 to iterative data processing circuit 770 as read data 707. Iterative data processing circuit 770 determines whether there are any errors in read data 707. Where there are no errors in read data 707, iterative data processing circuit 770 provides an indication of convergence and the memory write completes. Where, alternatively, errors still remain, iterative data processing circuit 770 indicates a number of additional encoding bits that would be need to be included to correct all of the errors detected as an augmentation output 788. In turn, memory access controller 720 selects a subset of the second set of encoding data 706 corresponding to the number indicated by augmentation output 788 and stores the additional encoding data to flash memory cells 740. This may be stored in a location co-located with write data set 705 or may be stored at a different location. Alternatively, this data may be stored along with the metadata maintained in and/or for flash memory cells 740. Based upon the disclosure provided herein, one of ordinary skill in the art will recognize various locations that the subset of the second set of encoding data 706 may be stored.

It should be noted that while not shown in the embodiment of FIG. 7, a data degradation may be applied to the read back data similar to that discussed above in relation to other embodiments to simulate the effects of time on data stored in flash memory cells 740. In such a case, the degraded data is provided to iterative data processing circuit 770 and the additional encoding data, if any determined based upon processing the degraded data.

A data read is effectuated when host controller circuit 760 provides address 710 along with a request to read data from the corresponding location in flash memory cells 740. It is determined if any additional encoding data was stored in relation to the requested read data during the write process. If no additional encoding data was stored, then a standard read using the first set of encoding data is performed. Alternatively, additional encoding data was stored that data (i.e., the subset of the second set of encoding data) is also read back from flash memory cells 740 and used with the standard read data to recover the originally written data set. In any event, the read data (either the standard read data including only the first set of encoding data, or the augmented read data including the standard read data augmented with the subset of the second set of encoding data) is accessed as read voltage 745 from locations indicated by address 723 and compares the voltage to a number of threshold values to reduce the voltage to a multi-bit read data 755. Using the same two bit example, the following multi-bit read data 755 results:

| Voltage Input | Two Bit Data Output |
|---|---|
| >V2 | '11' |
| >V1 | '10' |
| >V0 | '00' |
| <=V0 | '01' |

This multi-bit read data 755 is provided from memory access controller 720 to iterative data processing circuit 770 as read data 707. Iterative data processing circuit 770 determines whether there are any errors in read data 707. Where there are no errors in read data 707, iterative data processing circuit 770 provides read data 707 as read data 775. It should be noted that the aforementioned table is merely an example, and that different devices may assign different bit values to the different voltage thresholds. For example in other cases the values in the following table may be used:

| Voltage Input | Two Bit Data Output |
|---|---|
| >V2 | '01' |
| >V1 | '00' |
| >V0 | '10' |
| <=V0 | '11' |

Of course, other bit patterns may be assigned to different thresholds.

Where errors remain, iterative data processing circuit 770 generates or accesses soft data corresponding to read data 707. Such soft data indicates a probability that given elements of read data 707 are correct. In some cases, this soft data is provided by read circuit 750 as soft data 754 and indicates a difference between read voltage 745 and a threshold value for the elements of read data 755. This soft information is provided to iterative data processing circuit 770 as soft data 772. In other embodiments of the present invention, the soft data is not available from read circuit 750. In such embodiments, the soft data may be generated. Such generation of soft data may be done using any approach known in the art for generating soft data. As one example, generation of soft data may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

Iterative data processing circuit 770 repeatedly applies a data decoding algorithm to read data 707 and soft data 772 to yield a decoded output. In some cases, read data 707 is the same as read data 755 and soft data 772 is the same as soft data 754. Where the decoded output converges (i.e., results in a correction of all remaining errors in read data 707), the decoded output is provided as read data 775. Where the decoded output fails to converge (i.e., errors remain in the decoded output), another iteration of the data decoding algorithm is applied to read data 707 guided by the previous decoded output to yield an updated decoded output. This process continues until either all errors are corrected or a timeout condition occurs (e.g., 700 iterations). In some embodiments of the present invention, the data decoding algorithm is a low density parity check algorithm as is known in the art. It should be noted that while the data processing circuit 770 is disclosed as an iterative processor, that it may be replaced by other types of data processors that are not iterative in nature. Based upon the disclosure provided herein, one of ordinary skill in the art will recognize a variety of data decoding algorithms that may be used in relation to various embodiments of the present invention.

Figure 8A:
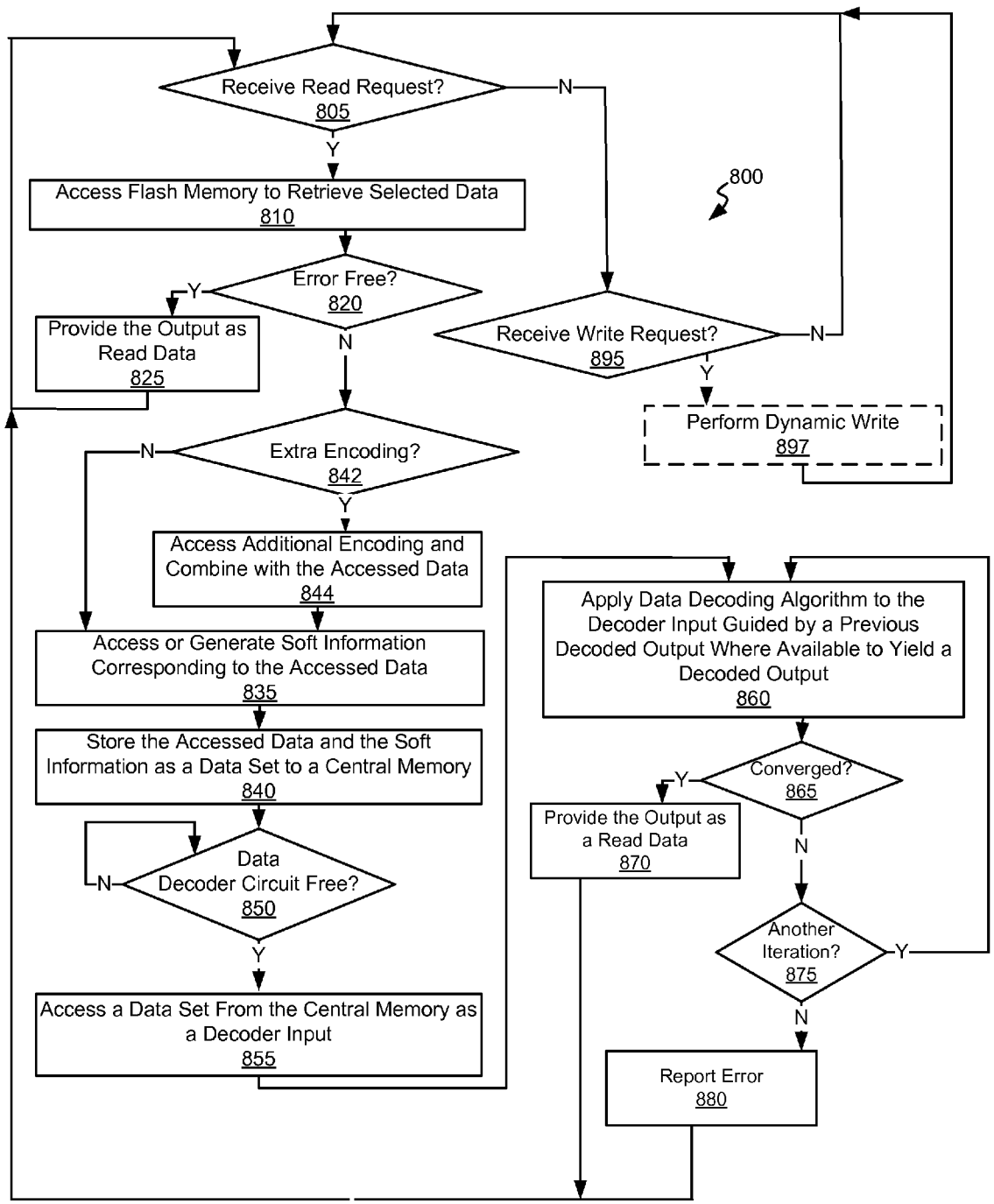
FIGS. 8a-8b are flow diagrams show yet another method for flash memory access using extended encoding selection during a write operation in accordance with various embodiments of the present invention.
Figure 8B:
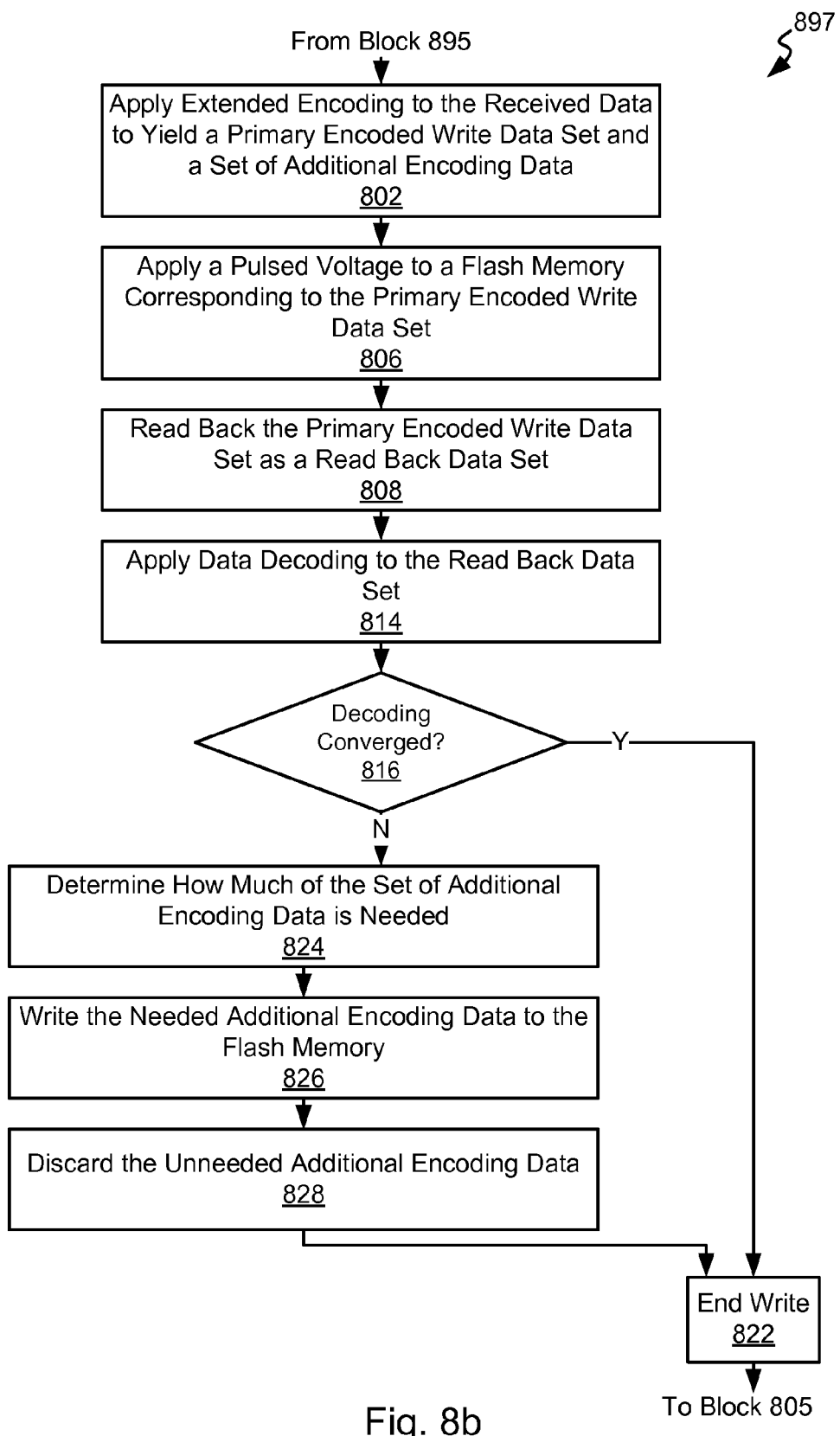

Turning to FIGS. 8a-8b, flow diagrams 800,897 show yet another method for flash memory access using extended encoding selection during a write operation in accordance with various embodiments of the present invention. Following flow diagram 800 of FIG. 8a, it is determined whether a read request is received (block 805). Where a read request is not received (block 805), it is determined whether a write request has been received (block 895). Where a write request is received (block 895), data received is formatted and written to a location in the flash memory indicated by an address received as part of the write request. This write process is a dynamic write utilizing, where needed, additional encoding data to assure a proper write (block 897). The write process is shown in dashed lines and is shown in more detail in relation to FIG. 8b. Once the write completes, the process returns to block 805.

Alternatively, when a read access is received (block 805), it includes an address indicating a location from which the data is to be accessed. Data is then accessed from the flash memory at the location indicated by the read request (block 810). It is determined whether the retrieved data is error free (block 820). Where it is determined that the data is error free (block 820), the retrieved data is provided as read data (block 825), and the process returns to block 805.

Otherwise, where it is not determined that the data is error free (block 820), it is determined whether extra encoding was maintained during the original write of the data (i.e., a subset of the set of additional encoding data discussed below in relation to FIGS. 8b and 9) (block 842). Where extra encoding was stored during the original write (block 842), this extra encoding is accessed and combined with the retrieved data (block 844). Soft information corresponding to the accessed data (either including or not including the extra encoding) is either accessed or generated (block 835). Such soft information indicates a probability that given elements of the accessed data are correct. In some cases, this soft information is provided by a solid state memory device from which the data was accessed. In other cases, the soft information is generated. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

The accessed data and the corresponding soft information is stored as a data set to a central memory (block 840). It is then determined whether the data decoder circuit is available for processing (block 850). Where the data decoder circuit is available for processing (block 850), a previously stored data set is accessed from the central memory as a decoder input (block 855). A data decoding algorithm is applied to the accessed data set to yield a decoded output (block 860). Where available (i.e., for the second and later iterations), a previous decoded output is used to guide application of the data decoding algorithm. In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention. It is determined whether the decoded output converged (block 865). Where it is determined that the decoded output converged (block 865), the decoded output is provided as read data (block 870), and the process returns to block 805.

Alternatively, where it is determined that the decoded output failed to converge (block 865). It is determined whether another iteration of the data decoding algorithm is allowed (block 875). In some cases, a maximum number of iterations of the data decoding algorithm is fixed or programmable. This is effectively a timeout condition. In some cases, the maximum number of allowable iterations of the data decoding algorithm is one hundred. Based upon the disclosure provided herein, one of ordinary skill in the art will recognize other numbers of iterations that may be allowed in relation to different embodiments of the present invention. Where another local iteration is not allowed (block 875), an error is indicated (block 880) and the process returns to block 805. Otherwise, where another iteration of the decoding algorithm is allowed (block 875), the processes of blocks 860-675 are repeated.

Turning to FIG. 8b and following flow diagram 897 that corresponds to block 897 of FIG. 8a, extended encoding is applied to the data set that is to be written to the flash memory (block 802). This extended encoding yields the original write data set plus encoding information that is expected to be written to the flash memory device that together comprise a primary encoded write data set, and a set of additional encoding data that may be written to the flash memory device if it is determined to be needed. In some cases, such extended encoding may be a low density parity check encoding as is known in the art. Based upon the disclosure provided herein, one of ordinary skill in the art will recognize other encodings that may be applied in accordance with different embodiments of the present invention.

A pulsed voltage is applied to a flash memory corresponding to the entire primary encoded write data set (block 806). The number and duration of the pulses during this initial write process may be selected such that it is expected to result in a complete write of the flash memory. The primary encoded write data set is read back from the flash memory with the result being a read back data set (block 808). This read back data set is similar to the data set that would be read back during a standard read of the flash memory, and thus would be provided to a data decoding circuit if a standard read was being performed.

Data decoding is applied to the read back data set to yield a decoded output (block 814). It is determined whether the decoding converged (i.e., whether any errors remained) (block 816). Where the decoding converged (block 816), the standard number of encoding data included in the primary encoded write data set was sufficient and the write process ends (block 822). Alternatively, where the decoding failed to converge (block 816), the standard number of encoding data included in the primary encoded write data set was insufficient. In such a case, it is determined how much of the set of additional encoding data is needed to allow the decoding to converge (block 824). It may be that the standard number of encoding data allowed the decoder to indicate how many errors remained, but not to identify the location of the errors. In this case, it is possible to determine how many more parity bits would have allowed for the identified number of errors to be corrected. A subset of the set of additional encoding data corresponding to the number of bits needs to correct the remaining errors is stored to the flash memory (block 826). All of the rest of the set of additional encoding data are discarded (block 828). With the additional encoding stored or set to be stored to the flash memory, the write process ends (block 822).

Turning to FIG. 9, a flow diagram 997 shows the method of FIG. 8b modified to additionally include data degradation in accordance with other embodiments of the present invention. Following flow diagram 997 that corresponds to block 897 of FIG. 8a, extended encoding is applied to the data set that is to be written to the flash memory (block 902). This extended encoding yields the original write data set plus encoding information that is expected to be written to the flash memory device that together comprise a primary encoded write data set, and a set of additional encoding data that may be written to the flash memory device if it is determined to be needed. In some cases, such extended encoding may be a low density parity check encoding as is known in the art. Based upon the disclosure provided herein, one of ordinary skill in the art will recognize other encodings that may be applied in accordance with different embodiments of the present invention.

A pulsed voltage is applied to a flash memory corresponding to the entire primary encoded write data set (block 906). The number and duration of the pulses during this initial write process may be selected such that it is expected to result in a complete write of the flash memory. The primary encoded write data set is read back from the flash memory with the result being a read back data set (block 908). This read back data set is similar to the data set that would be read back during a standard read of the flash memory, and thus would be provided to a data decoding circuit if a standard read was being performed.

The read back data set is purposely degraded to yield a degraded data set (block 912). The degrading process may be any process known in the art that is capable of marginalizing one or more bits of the read back data set. In one particular embodiment of the present invention, the read back data set is marginalized by adjusting the threshold values used by a read circuit such that the resulting read data is less accurate (i.e., marginalized). In other embodiments, the marginalization may include deliberating erasing a selected number of bits of the read back data as part of applying a data decode process and/or by limiting the number of iterations that a data decoder circuit is allowed to apply to the read back data. Based upon the disclosure provided herein, one of ordinary skill in the art will recognize a variety of other approaches that may be used to degrade the read back data in accordance with different embodiments of the present invention. The magnitude of the marginalization may be selected such that the resulting read back data represents a certain amount of flash memory drift that would be expected over time. In some cases, the marginalization applied to the read back data set is greater than an amount of deterioration the flash memory cells will experience during normal operation.

By allowing the use of encoding information in addition to the standard encoding information that would be expected in relation to each of the codewords written to the flash memory, write speed may be enhanced as multiple write programming periods otherwise needed to assure full programming may be eliminated by including the additional encoding. Further, the possibility of overwriting a flash device may be reduced where an underwrite condition can be mitigated by the use of the additional encoding data. In some cases, the marginalization applied as part of degrading the read back data set may be dynamically selected. This dynamic marginalization allows for the device to be modified to prevent saving more than the number of additional encoding bits than are needed.

Data decoding is applied to the degraded data set to yield a decoded output (block 914). It is determined whether the decoding converged (i.e., whether any errors remained) (block 916). Where the decoding converged (block 916), the standard number of encoding data included in the primary encoded write data set was sufficient and the write process ends (block 922). Alternatively, where the decoding failed to converge (block 916), the standard number of encoding data included in the primary encoded write data set was insufficient. In such a case, it is determined how much of the set of additional encoding data is needed to allow the decoding to converge (block 924). It may be that the standard number of encoding data allowed the decoder to indicate how many errors remained, but not to identify the location of the errors. In this case, it is possible to determine how many more parity bits would have allowed for the identified number of errors to be corrected. A subset of the set of additional encoding data corresponding to the number of bits needs to correct the remaining errors is stored to the flash memory (block 926). All of the rest of the set of additional encoding data are discarded (block 928). With the additional encoding stored or set to be stored to the flash memory, the write process ends (block 922).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for accessing a flash memory device, the system comprising:
    a flash memory write circuit operable to apply a first write signal to a flash memory to yield a stored data set;
    a flash memory read circuit operable to read the stored data set from the flash memory as a read back input;
    a read back degrade circuit operable to degrade the read back input to yield a degraded output;
    a data decoder circuit operable to apply a data decoding algorithm to the degraded output to yield a decoded output and a bit error rate; and
    wherein the flash memory write circuit is further operable to apply a second write signal to the flash memory when the bit error rate exceeds a threshold value.

2. The system of claim 1, wherein the data decoder circuit is selected from a group consisting of: a low density parity check decoder circuit operable to apply a low density parity check decoder algorithm to the degraded output to yield the decoded output and the bit error rate, and a comparator circuit operable to compare the degraded output to the stored data set to yield a number of bit errors as the bit error rate.

3. The system of claim 1, wherein the threshold value is dynamic.

4. The system of claim 3, wherein the threshold value is set at a first threshold level when the flash memory has been accessed a first number of times, and wherein the threshold value is set at a second threshold level when the flash memory has been accessed a second number of times.

5. The system of claim 1, wherein the threshold value is user programmable.

6. The system of claim 1, wherein the read back degrade circuit comprises:
    a read threshold modification circuit operable to modify a read threshold of the flash memory read circuit to produce the degraded output.

7. The system of claim 6, wherein the read threshold is modified such that the degraded output corresponds to the stored data set after a defined amount of time in the flash memory.

8. The system of claim 1, wherein the read back degrade circuit comprises:
    a bit erase circuit operable to modify a selected number of bits in the stored data set to correspond to an erase state of the flash memory device.

9. The system of claim 1, wherein the system is implemented as part of an integrated circuit.

10. A system for accessing a flash memory device, the system comprising:
    a flash memory write circuit operable to apply a first write signal to a flash memory to yield a stored data set;
    a flash memory read circuit operable to read the stored data set from the flash memory as a read back input;
    a low density parity check data decoder circuit operable to apply a low density parity check data decoding algorithm to a decoder input derived from the read back input to yield a decoded output; and
    wherein the flash memory write circuit is further operable to selectively apply a second write signal to the flash memory based at least in part on the decoded output.

11. The system of claim 10, wherein the system further comprises:
    a read back degrade circuit operable to degrade the read back input to yield a degraded output, wherein the decoder input is derived from the degraded output.

12. The system of claim 11, wherein the low density parity check data decoder circuit is further operable to yield a bit error rate associated with the decoded output, and wherein the flash memory write circuit is further operable to apply a second write signal to the flash memory based at least in part on the bit error rate.

13. The system of claim 10, wherein selective application of the a second write signal to the flash memory is based upon a comparison of a bit error rate with a threshold value, wherein the bit error rate is derived from the decoded output, and wherein the threshold value is dynamic.

14. The system of claim 13, wherein the threshold value is set at a first threshold level when the flash memory has been accessed a first number of times, and wherein the threshold value is set at a second threshold level when the flash memory has been accessed a second number of times.

15. The system of claim 11, wherein the read back degrade circuit comprises:
    a read threshold modification circuit operable to modify a read threshold of the flash memory read circuit to produce the degraded output.

16. The system of claim 15, wherein the read threshold is modified such that the degraded output corresponds to the stored data set after a defined amount of time in the flash memory.

17. The system of claim 11, wherein the read back degrade circuit comprises:
    a bit erase circuit operable to modify a selected number of bits in the stored data set to correspond to an erase state of the flash memory device.

18. The system of claim 10, wherein the system is implemented as part of an integrated circuit.

19. A system for accessing a flash memory device, the system comprising:
    an auxiliary parity generation circuit operable to generate an additional parity data for a write data set;
    a flash memory write circuit operable to apply a first write signal corresponding to the write data set to a flash memory to yield a stored data set;
    a flash memory read circuit operable to read the stored data set from the flash memory;
    a data decoder circuit operable to apply a data decoding algorithm to the read data to determine if the decoding fails to converge; and
    wherein the flash memory write circuit is further operable to write a portion of the additional parity only if the decoding fails to converge.

20. The system of claim 19, wherein the system is implemented as part of an integrated circuit.

* * * * *